(12) United States Patent
Liran et al.

(10) Patent No.: US 10,411,688 B1
(45) Date of Patent: Sep. 10, 2019

(54) ULTRA-LOW POWER DRIVER OF REFERENCE VOLTAGE

(71) Applicants: Tuvia Liran, Qiryat Tivon (IL); Uzi Zangi, Hod-Hasharon (IL); Tzach Hadas, Zichron Yaakov (IL)

(72) Inventors: Tuvia Liran, Qiryat Tivon (IL); Uzi Zangi, Hod-Hasharon (IL); Tzach Hadas, Zichron Yaakov (IL)

(73) Assignee: PLSense Ltd., Yokneam Elit (IL)

( * ) Notice: Subject to any disclaimer, the term of this patent is extended or adjusted under 35 U.S.C. 154(b) by 0 days.

(21) Appl. No.: 16/016,625

(22) Filed: Jun. 24, 2018

(51) Int. Cl.
*H03K 5/24* (2006.01)
*H03K 17/687* (2006.01)

(52) U.S. Cl.
CPC ....... *H03K 5/2481* (2013.01); *H03K 17/6872* (2013.01)

(58) Field of Classification Search
CPC ............... H03K 5/2481; H03K 17/6872; B41J 2/04541; B41J 2/0455; B41J 2/04581

USPC .......................................................... 327/108
See application file for complete search history.

(56) References Cited

U.S. PATENT DOCUMENTS

| | | | |
|---|---|---|---|
| 7,978,010 B2* | 7/2011 | Lee | H03F 3/303 330/255 |
| 10,245,827 B2* | 4/2019 | Abe | B41J 2/04541 |
| 2018/0123519 A1* | 5/2018 | Waller, Jr. | H03F 1/0238 |

* cited by examiner

*Primary Examiner* — Dinh T Le

(57) ABSTRACT

A method and apparatus for implementing a CMOS buffer for driving a reference voltage that consumes very low current in normal operating conditions but drive high current when output voltage is off, tracking the required reference voltage. The circuit is operating in a "deadzone" most of the time, where pull-up and pull-down current paths are blocked, and ultra-low power comparators, with build-in offset, are monitoring the output voltage continuously, and driving compensation current, when needed. The circuit can be manufactured with a standard CMOS processing technology.

3 Claims, 2 Drawing Sheets

Schematics of the low power driver of reference voltage its transconductance transfer function

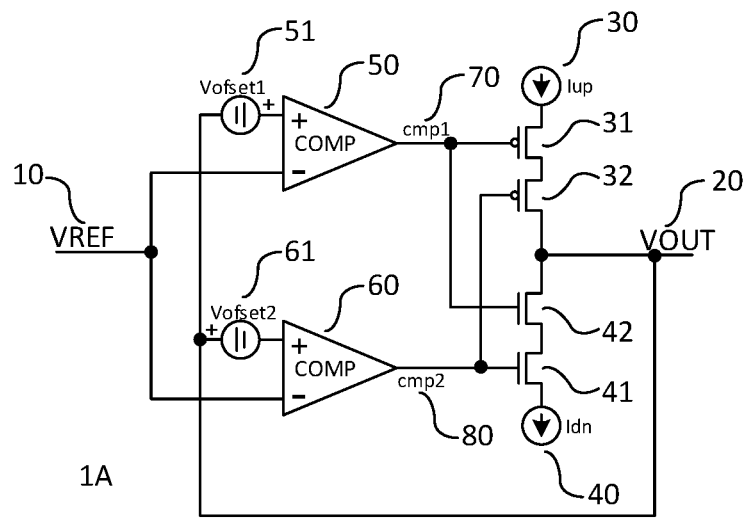
Figure 1A: Schematics of the low power driver of reference voltage
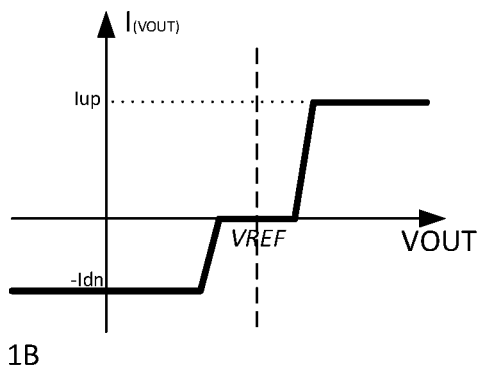
Figure 1B: its transconductance transfer function
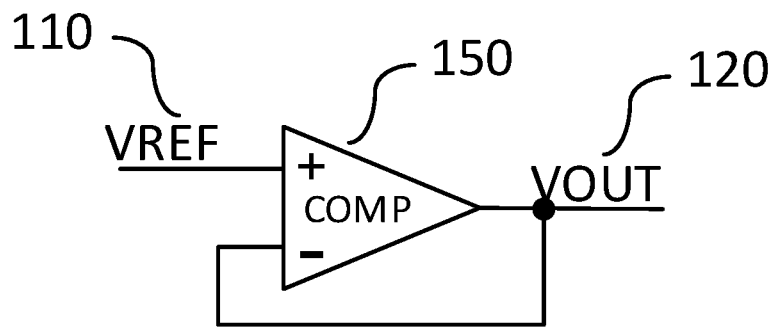
Figure 2: Schematic of conventional driver of reference voltage (prior art)

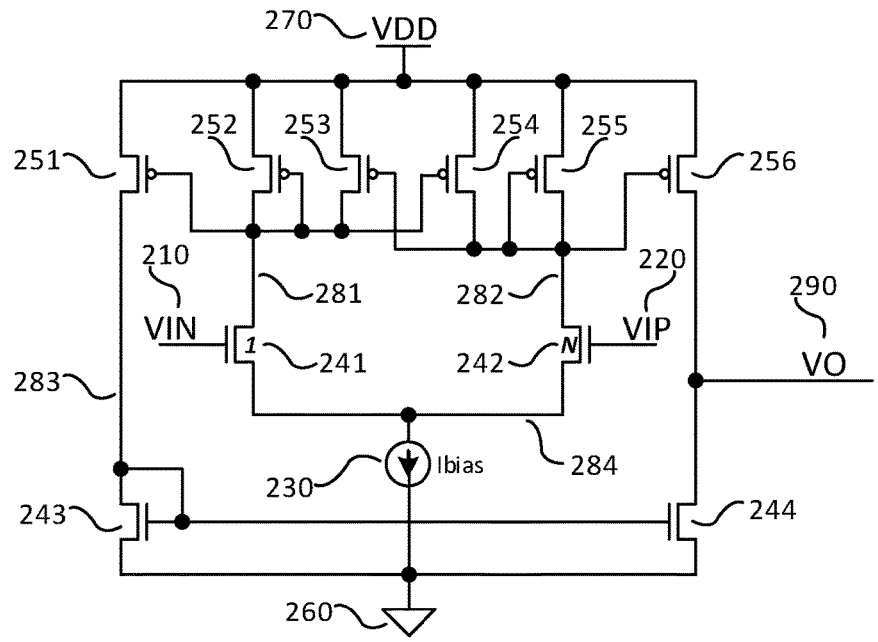
Figure 3: Example of asymmetric sub-threshold comparator with build-in offset
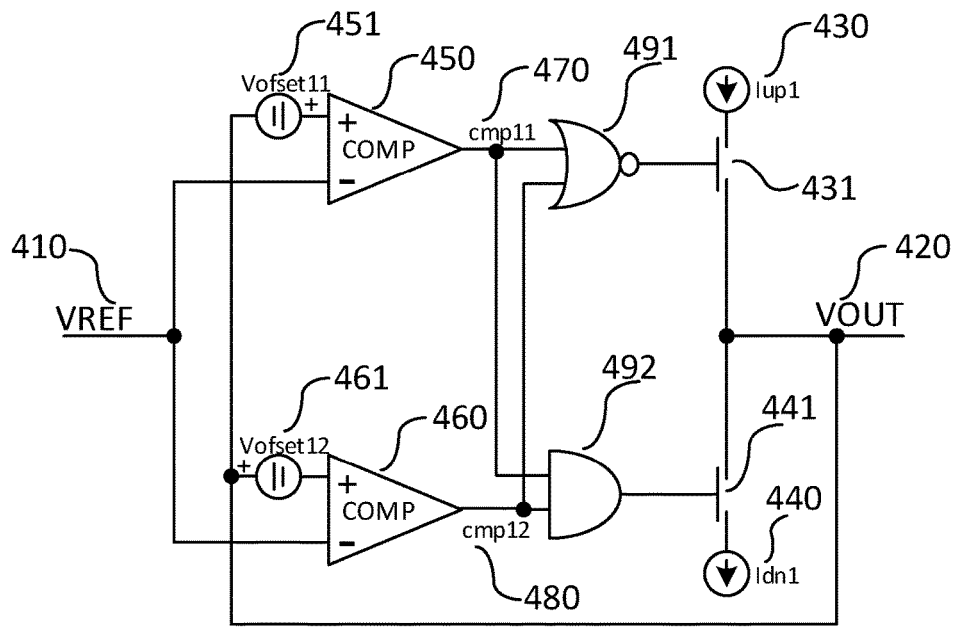
Figure 4: Schematics of a version of the embodiment of this invention, with single switch for pull-up and single switch for pull-down current in driver's output

ULTRA-LOW POWER DRIVER OF REFERENCE VOLTAGE

REFERENCES

U.S. Pat. No. 6,255,909—Ultra Low Voltage CMOS Class AB Power Amplifier with Parasitic Capacitance Internal Compensation
U.S. Pat. No. 6,084,472—Multi-Tanh Triplet with Optimal Basing
U.S. Pat. No. 3,851,259—Deadzone circuit
U.S. Pat. No. 4,195,240—Voltage Comparator Circuit Having Dead Zone
U.S. Pat. No. 4,277,695—Amplifier Having Dead Zone of Controllable Width and Position
U.S. Pat. No. 3,229,217—"H" Network D.C. Amplifier Having A Dead Zone Transfer Characteristic for Eliminating Idling Currents
U.S. Pat. No. 6,288,605—Power Switching Output Stage with Dead Zone Minimization and Possibility of Parallel Synchronous Connection
U.S. Pat. No. 6,614,302—CMOS Operational Amplifier Circuit
U.S. Pat. No. 6,614,301—Differential Amplifier Offset Adjustment
US 2003/0132786—Asymmetric Comparator for Low Power Applications

FIELD OF THE INVENTION

The invention relates to CMOS analog circuits and more specific to ultra-low power design of CMOS analog circuits.

BACKGROUND OF THE INVENTION

Driver circuit for reference voltage should reflects the input reference voltage to the output, while driving it with significantly lower output impedance. The conventional circuit for driving reference voltage uses high power and typically, uses amplifier which is implemented as class A or class AB or class B amplifier.

In battery operated, or in energy harvesting applications, there is a need to minimize the power consumption. It is necessary to provide circuit that consume power that is close to their minimum theoretical power. Such circuits should consume power only when they need to perform a change in their outputs.

There are low power applications that require reference voltage. An example is a driver for LCD display that have one or two reference voltage for driving the segments in the display. Such application might be operated by batteries, such as in water consumption monitors. In such application, the current load is low, but switching noise might shift the output beyond the desired range.

PRIOR ART

The circuit in FIG. 2 which show schematic of conventional driver of reference voltage from prior art has several disadvantages, which are:
1. When implementing the amplifier with class A amplifier (device 150 in FIG. 2.), there is a continuous DC current consumption even when no voltage compensation to the output is needed. For achieving low output impedance, the power consumption should be increased as well.
2. When implementing the amplifier with class AB amplifier (device 150 in FIG. 2.), there is still some DC current. Thus, the same dis-advantages that had been described for class A in previous chapter are valid also for class AB amplifier, although it might be slightly more power effective. The power efficiency is affected by optimal tuning of the circuits and device matching, as described in U.S. Pat. No. 6,255,909.
3. When implementing the amplifier with class B amplifier (device 150 in FIG. 2.), it might provide low current when the circuit is well tuned. However, in these amplifiers, the pull-up and pull-down output transistors are biased to their edge of turn-on voltage, thus each shift of the biasing conditions will either cause an increase of current or cause a "dead zone" when the amplifier's output (node 120 in FIG. 2) is not tracking the input reference voltage (node 110 in FIG. 2). Such shifts can be caused either due to process variation or device mismatching.

U.S. Pat. No. 6,255,909 describes an ultra-low voltage CMOS class AB power amplifier. It does not describe a comparator and directed to other applications.

U.S. Pat. No. 6,084,472 describes a technique for controlling the offset of a BJT based amplifier by controlling the bias current. In this patent, we are shifting the offset in different way, and using CMOS transistors only.

U.S. Pat. No. 3,851,259 describes a technique for generating "deadzone" in the input to output response function, by using two comparators with shifted offset. The offset shifting is done by loading the output with extra load and driving two additional reference voltages.

U.S. Pat. No. 4,195,240 describes a voltage comparator circuit having dead zone generated by a BJT based circuit, and by consuming significant amount of current for generating the "deadzone".

U.S. Pat. No. 4,277,695 describes an amplifier having dead zone of controllable width and position generated by a BJT based circuit, and by consuming significant amount of current for generating the "deadzone".

U.S. Pat. No. 3,229,217 describes an amplifier with a dead zone transfer characteristic for eliminating idle current. It is a BJT based circuit that consume significant amount of current for generating the "deadzone".

U.S. Pat. No. 6,288,605 describes a Power Switching Output Stage with Dead Zone with sensing circuit that consumes extra DC current for minimization the possibility of parallel synchronous connection between pull-up and pull-down transistors.

U.S. Pat. No. 6,614,302 describes a CMOS operational amplifier circuit with dead zone, having two symmetric differential amplifiers, and an extra change-over circuit that consumes extra power, for activating only one of the amplifiers. This circuit have unconstrained output current, and different mechanism to control the "deadzone".

U.S. Pat. No. 6,614,301 describes a differential amplifier with offset adjustment which consumes some extra current for adjusting the offset.

Patent US2003/0132786 describes an asymmetric comparator for low power applications, operating in strong inversion mode of its transistors, using asymmetric differential pairs, caused by ratioed W/L of the two differential pairs. This circuit consumes more power than the invented circuit, it does not operate at sub-threshold region of the transistors, and output current is not constrained.

BRIEF SUMMARY OF THE INVENTION

This current invention is described in the circuit of FIG. 1A. The functionality is basically the same as in the prior art presented in FIG. 2, but it provides several significant changes and advantages.

The target of this circuit is to reduce the supply current consumption to the minimum possible, mostly for supporting applications where power consumption is a critical parameter. This goal is addressing the case where output voltage level is close enough to the input reference voltage, and low tolerance of the output voltage, and slow response time of the driver circuit is acceptable for the desired application.

For one embodiment of the invention include the use of "dead zone" of output voltage levels, where minor variation of output voltage will not activate any correction action by the feedback circuit, thus will not consume significant power in steady state conditions.

An additional, embodiment of the invention also includes the use of asymmetric comparator, whose CMOS transistors are operating in sub-threshold range, thus consume very low power.

An additional, embodiment of the invention also targets for operating in wide range of supply voltages, but the "dead zone" is independent of the supply voltage, independent of process parameters, and depends only on the structure of the circuit and the operation temperature.

An additionally, embodiment of the invention also constrains the output current, thus avoiding high current during power-up, or when voltage is changed fast due to interference, such as switching event in the load.

BRIEF DESCRIPTIONS OF THE DRAWINGS

The invention may be understood by referring to the following description and accompanying drawings that are used to illustrate the embodiments of the invention. In the drawings:

FIG. 1A is a schematic of the low power driver of reference voltage, which describes the embodiments of the current invention circuit. FIG. 1B describes the trans-conduction transfer function of the circuit.

FIG. 2 is a schematic of conventional driver of reference voltage, which is the prior art for this invention.

FIG. 3 is one example schematic of asymmetric sub-threshold comparator with build-in offset, which is one version of the embodiment of the current invention.

FIG. 4 is a schematic of one version of the embodiment of the current invention, with single switch for pull-up and single switch for pull-down current in driver's output, which is another embodiment of this invention.

DETAILED DESCRIPTION OF THE INVENTION

The current invention includes a method and apparatus for an ultra-low power CMOS driver of reference voltage, which receives a reference voltage from a high impedance source and drives it into a load which may have leakage current or noise.

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

For one embodiment of the invention, the implemented circuit can maintain the output voltage of this circuit, VOUT (node 20 for FIG. 1A), while consuming very low power. Power consumption is minimized for enabling the use in battery-operated systems, or for enabling the use with energy harvesting power source.

The invented circuit can be manufactured by various CMOS (Complementary Metal Oxide Semiconductor) processes.

In all figures describing schematics, the bulk connection is not described. Typically, the bulk of all NMOS transistors is connected to the P-well, or the P+ substrate of the integrated circuit, and it is connected electrically to the negative supply voltage of each circuit. The bulk of all PMOS transistors is connected to the N-well, and it is connected electrically to the positive supply voltage of each circuit.

The operation of the circuit, as described in FIG. 1A, is the following:

1. Node VREF (node 10 of FIG. 1A) is the input reference voltage, which might have high output impedance. The voltage of the VOUT output (node 20 for FIG. 1A) should follow the voltage of VREF (node 10 of FIG. 1A).
2. The output VOUT node (node 20 for FIG. 1A) is compared to input VREF (node 10 of FIG. 1A) by two comparators.
3. First comparator (device 50 of FIG. 1A) has negative offset voltage of Voffset1 (represented by 51 of FIG. 1A), and its output cmp1 (node 70 of FIG. 1A) is driven to the voltage of the upper supply, turning off PMOS transistor 31 of FIG. 1A, and turning on NMOS transistor 42 of FIG. 1A.
4. Second comparator (device 60 of FIG. 1A) has positive offset voltage of Voffset2 (represented by 61 of FIG. 1A), and its output cmp2 (node 80 of FIG. 1A) is driven to the voltage of the lower supply, turning on PMOS transistor 32 of FIG. 1A, and turning off NMOS transistor 41 of FIG. 1A.
5. When the voltage of VOUT node (node 20 for FIG. 1A) is more than VREF (node 10 of FIG. 1A) minus absolute value of Voffset1 (device 51 of FIG. 1A), and also less than VREF (node 10 of FIG. 1A) plus absolute value of Voffset2 (device 61 of FIG. 1A), both current sources Iup (device 30 of FIG. 1A), and Idn (device 40 of FIG. 1A) are switched off. In that case, no current is driven to or from VOUT (node 20 of FIG. 1A), thus these high current sources do not consume power from the power supply.
6. The sum of the absolute values of Vofset1 (symbol 51 in FIG. 1A) and Vofset2 (symbol 61 in FIG. 1A) is named "deadzone". In that range of output voltage, no correction of the voltage is performed, as described in FIG. 1B, and the current consumed by the circuit from the power supply is minimized.
7. When the voltage of VOUT node (node 20 for FIG. 1A) is more than VREF (node 10 of FIG. 1A) and absolute value of Voffset2 (device 61 of FIG. 1A), the outputs of both comparators, cmp1 (node 70 of FIG. 1A) and cmp2 (node 80 of FIG. 1A) are at high logic state, causing both NMOS switching transistors (devices 41 and 42 of FIG. 1A) to switch on, and both PMOS switching transistors (devices 31 and 32 of FIG. 1A) to switch off. In that case, current source Idn (device 40 of FIG. 1A) will sink current from VOUT (node 20 of FIG. 1A) and will pull the voltage on VOUT (node 20 of FIG. 1A) down.
8. When the voltage of VOUT node (node 20 for FIG. 1A) is less than VREF (node 10 of FIG. 1A) minus the absolute value of Voffset1 (device 51 of FIG. 1A), the outputs of both comparators, cmp1 (node 70 of FIG. 1A) and cmp2 (node 80 of FIG. 1A) are at low logic state, causing both NMOS switching transistors (devices 41 and 42 of FIG. 1A) to switch off, and both PMOS switching transistors (devices 31 and 32 of FIG. 1A) to switch on. In that case, current source Iup (device 30 of FIG. 1A) will draw current to VOUT (node 20 of FIG. 1A) and will pull the voltage on VOUT (node 20 of FIG. 1A) up.

For another embodiment of the invention, the input VREF (node 10 of FIG. 1A), and/or the output VOUT (node 20 for FIG. 1A), might be connected to the pad of the chip. This pad is typically protected from ESD damage, thus require a protection circuit, which are not described here, since it is beyond the scope of this invention.

The operation of the comparator circuit with embedded offset, as described in FIG. 3, is the following:
1. The circuit is comparing the positive input VIP (Node 220 in FIG. 3) with negative input VIN (Node 210 in FIG. 3).
2. The inputs are connected to asymmetric differential NMOS transistors. VIP (Node 220 in FIG. 3) is connected to NMOS transistor 242 in FIG. 3, and VIN is connected to NMOS transistors 241 in FIG. 3. The width (W) to length (L) ratio of transistor 242 in FIG. 3 is N times larger than the width (W) to length (L) ratio of transistor 241 in FIG. 3. Typically, it is implemented by laying transistor 242 in FIG. 3 by multiplying transistor 241 in FIG. 3 N times.
3. A bias current source, represented as device 230 in FIG. 3, is driving very low current, thus constraining the current consumption of the circuit to very low level, typically in the range of few nano-amperes to few tens of nano-amperes.
4. The current of PMOS transistor 255 is mirrored to PMOS transistor 256 in FIG. 3. Similarly, PMOS transistor 252 is mirrored to PMOS transistor 251 in FIG. 3. When the voltage in VIP (Node 220 in FIG. 3) is larger than the voltage in VIN (Node 210 in FIG. 3) by more than the offset voltage, the current through NMOS transistor 242 and PMOS transistor 255 in FIG. 3 are approaching the bias current in device 230 in FIG. 3. In that case, the current in NMOS transistor 241 and PMOS transistor 252 in FIG. 3 are approaching zero.
5. PMOS transistors 253 and 254 in FIG. 3 are acting as regenerative amplifier. When the current is flowing mostly via NMOS transistor 242 and PMOS transistor 255 in FIG. 3, the voltage in node 282 in FIG. 3 drops below VDD (node 270 in FIG. 3) by more than the threshold voltage of PMOS transistors, thus pulling node 282 of FIG. 3 up by transistor 253 of FIG. 3 to closer to VDD (node 270 in FIG. 3), thus "stealing" current from transistor 252 of FIG. 3. As a result, these two regenerative transistors are amplifying the difference between the current in the two current paths, causing the entire current of device 230 in FIG. 3 to flow to transistor 255 in FIG. 3, unless the differential voltage is close to its equilibrium state. When the voltage in the two inputs is swapped, the current will be directed and mirrored to the opposite side of the circuit.
6. When transistor 256 in FIG. 3 is conducting current, it pulls VO node (node 290 in FIG. 3) up. Simultaneously, transistor 252 in FIG. 3 is not conducting current to transistor 243 in FIG. 3. Transistor 244 I FIG. 3 is a mirror transistor to transistor 243 of FIG. 3, thus will not conduct current, and will not pull-down VO node (node 290 in FIG. 3). When VO (node 290 in FIG. 3) has pull-up current and no pull-down current, the voltage will be pulled up to full voltage swing, which is VDD (node 270 in FIG. 3). Similarly, when transistor 252 in FIG. 3 is conducting, and transistor 256 in FIG. 3 is not conducting, there is no pull-up current and there is a significant pull-down current in VO node (node 290 in FIG. 3), forcing VO (node 290 in FIG. 3) down all the way toward GND (node 260 in FIG. 3).
7. The low current of device 230 in FIG. 3 is forcing transistors 242 and 241 in FIG. 3 to operation in the sub-threshold region, where the current is an exponential function of the voltage. For achieving the same current in both transistors, 242 and 241 in FIG. 3, which will force the output of the circuit to its equilibrium state, the voltage in VIP (Node 220 in FIG. 3) should be lower than VIN (Node 210 in FIG. 3) by an offset voltage describe by the formula $Vos=k*T/q*In(N)$. In that formula, k is Boltzmann constant ($k=1.38*10^{-23}$ Joule/K; Joule is energy unit; K is temperature unit in Kelvin scale), T is the temperature in Kelvin scale, q is electron charge ($q=1.6*10^{-19}$ C; C is charge in Coulomb units), In is the natural logarithm function and N is the W/L ratio between transistors 242 to 241 in FIG. 3. In this formula, only the parameter T (temperature) is variable, while the rest are constant for a given ratio between the transistors. It means that it is not affected by the bias current, nor on the device parameters, nor on supply voltage. Increasing the ratio between the two differential transistors (N), the offset will be increased in logarithmic function. This means that the offset is constant for a given temperature.
8. In FIG. 3, the circuit is balanced when VIP (Node 220 in FIG. 3) is lower than VIN (Node 210 in FIG. 3), thus it has negative offset voltage. For achieving positive offset, the ratio between the two differential transistors, 242 and 241 in FIG. 3, should be swapped, making transistor 241 in FIG. 3 larger than transistor 242 of FIG. 3 larger.
9. An alternative embodiment of FIG. 3 is when each NMOS transistor is replaced by PMOS transistor, each PMOS transistor in replaced by NMOS transistor, and positive supply VDD (node 270 in FIG. 3) is swapped with negative supply GND (node 260 in FIG. 3). In that case, the offset will have inverted polarity, and the common mode voltage might be shifted.

The schematic of the implemented circuit in FIG. 1A is only an example. This implementation might have several versions, based on the same concept. An alternative version is presented in FIG. 4. It will be described in details later on.

This circuit should overcome any noise on the output of the circuit, which might shift the voltage in the output beyond the permitted "deadzone". Such noise can be generated either by switching of the load connected to VOUT (node 20 of FIG. 1A), or electromagnetic interference, or DC leakage current. The circuit in this invention is designed to compensate any of these drifts in the output voltage relatively fast, since it is switching a relatively high current even if the voltage is marginally exceeding the "deadzone".

Description of Different Example Circuit of this Invention

The embodiments of this invention circuit, as described in FIG. 1A, might have plurality of variations, based on similar principles of operations.

One optional variation of this invention, implementing a similar principle, is described in FIG. 4. In that embodiment, the two switching NMOS transistors 41 and 42 in FIG. 1A had been replaced by single NMOS transistor 441 in FIG. 4, and AND gate (device 492 in FIG. 4), performing the same function. Similarly, the two PMOS switches 31 and 32 in FIG. 1A had been replaced by single PMOS transistor 491 in FIG. 4, and NOR gate (device 491 in FIG. 4), performing the same function. This embodiment might reduce the area required for the stitching transistors, in case that high output current is required.

Advantages of the Invented Embodiments

In the conventional circuit of the prior art circuit, which is described in FIG. 2, there is a continuous current in the comparator, even when there is no need for correction of the voltage in the output node. Typically, the amplifier (device 150 in FIG. 2) is implemented as class A or class AB or class B amplifier, which consume power continuously in comparison to the current invention circuit which consumes very low current when there is no need to correct the output voltage.

In addition, when low output impedance is needed, the power of the amplifier (device 150 in FIG. 2) should be increased. Even when implementing the amplifier (device 150 in FIG. 2) with class B amplifier, although the continuous power is reduced, but every minor fluctuation of output voltage, which might be caused by noise, will increase the power. In this invention, there is no additional current consumption as long as the output voltage is within the permitted "deadzone".

In addition, when implementing the comparators with "deadzone" by any of the prior art techniques, the range of the "deadzone" might be affected by process variation, and/or supply voltage, in addition to operating temperature and offset caused by device matching. In the current invention circuit, the "deadzone" is affected only by the temperature and device matching.

In addition, since the entire circuit is implemented only with NMOS and PMOS transistors, and does not require using resistors, the area consumed by the current invention circuit is fairly small.

In addition, the output current of the invented circuit is constrained by the source of the Iup (device 30 in FIG. 1A) and Idn (device 40 in FIG. 1A). In the circuits described in prior art, this current is not constrained. Constraining the current may be necessary for mitigating the high current during power-up, on in case of spiky load. In quite systems, which are common in ultra-low-power implementations, large current spikes might induce noise to other circuits as well.

What we claim is:

1. An integrated circuit, comprising:
   a CMOS driver integrated circuit that drives reference input voltage, wherein said CMOS driver have a "deadzone" in a transfer function between an input reference voltage and an output voltage of said CMOS driver;
   wherein a "deadzone" is implemented by two asymmetric comparators with embedded offset, wherein in one comparator there is a positive offset and in a second comparator there is a negative offset;
   wherein said asymmetric comparators are operating at sub-threshold region; wherein said offset of said comparators is caused by asymmetry between the width and length ratio of a two input differential transistors in the comparators, which are operating at sub-threshold region, causing an offset voltage to be independent of variations of transistor's parameters;
   wherein said CMOS driver circuit further comprises a switching circuit that is enabling pull-up current when both comparators indicate that output voltage is lower than the input voltage by more than said negative offset voltage of said comparators;
   wherein said CMOS driver circuit further comprises a switching circuit that is enabling pull-down current when both comparators indicate that output voltage is higher than the input voltage by more than said positive offset voltage of said comparators;
   wherein said CMOS driver circuit has no current to or from its output stage when the difference between output and input reference voltage is within the range of said "deadzone", wherein said "deadzone" is the output voltage range between VREF+offset1 and VREF−offset2.

2. The integrated circuit from claim 1, wherein the current consumption of said integrated circuit from the supply node is low when output voltage is within a range of said "deadzone" even when said "deadzone" is smaller than the variation of the offset voltage caused by device mismatching, enabling implementation of a driver with small "deadzone", wherein said "deadzone" is the output voltage range between VREF+offset1 and VREF−offset2.

3. The integrated circuit from claim 1, wherein the pull-up and pull-down current below or above said "deadzone", is constrained by current sources, thus constraining the supply current and avoiding over-correction of the output voltage.

* * * * *